(12) United States Patent
Reis et al.

(10) Patent No.: US 8,955,983 B2
(45) Date of Patent: Feb. 17, 2015

(54) THERMAL MANAGEMENT FOR HANDHELD PROJECTORS

(75) Inventors: Bradley E. Reis, Westlake, OH (US); Robert A. Reynolds, III, Bay Village, OH (US); Yin Xiong, San Diego, CA (US); Greg P. Kramer, Lyndhurst, OH (US); Robert J. Umpleby, Olmsted Falls, OH (US)

(73) Assignee: GrafTech International Holdings Inc., Parma, OH (US)

( * ) Notice: Subject to any disclaimer, the term of this patent is extended or adjusted under 35 U.S.C. 154(b) by 337 days.

(21) Appl. No.: 13/581,006

(22) PCT Filed: Feb. 28, 2011

(86) PCT No.: PCT/US2011/026470
§ 371 (c)(1),
(2), (4) Date: Nov. 15, 2012

(87) PCT Pub. No.: WO2011/106771
PCT Pub. Date: Sep. 1, 2011

(65) Prior Publication Data
US 2013/0057835 A1 Mar. 7, 2013

Related U.S. Application Data

(60) Provisional application No. 61/308,469, filed on Feb. 26, 2010.

(51) Int. Cl.
*G03B 21/16* (2006.01)
*H05K 7/20* (2006.01)
(Continued)

(52) U.S. Cl.
CPC ............... *G03B 21/16* (2013.01); *F21V 29/00* (2013.01); *H05K 1/02* (2013.01); *H05K 1/0201* (2013.01);
(Continued)

(58) Field of Classification Search
CPC ....... G03B 21/16; H04N 9/31; H04N 9/3144; F21V 29/00; H05K 1/02; H05K 1/0201; H05K 1/0203
USPC .......... 353/52; 165/10; 361/679.46, 688, 711; 257/712
See application file for complete search history.

(56) References Cited

U.S. PATENT DOCUMENTS 7,889,502 B1  2/2011  Reis et al.
2007/0081564 A1  4/2007  Kuhnelt et al.
(Continued)

FOREIGN PATENT DOCUMENTS

EP  1742524 A1  1/2007
EP  1783833 A2  5/2007
(Continued)

OTHER PUBLICATIONS

International Preliminary Report on Patentability issued for PCT/US2011/026470 on Sep. 7, 2012 by WIPO.
International Search Report and Written Opinion issued for PCT/US2011/026470 on May 18, 2011 by the European Patent Office.

*Primary Examiner* — Georgia Y Epps
*Assistant Examiner* — Magda Cruz

(57) ABSTRACT

A handheld device (10), including a projector module (20) which includes a light source having a laser or at least one light emitting diode; a thermal management system which includes a heat collector (30) formed of a material having a thermo-mechanical design constant of at least 10 mm-W/m*K and having a non-planar shape, the heat collector in thermal contact with the light source; a heat spreader (40) having a surface area at least 1.5 times that of the surface area of the heat collector and a thermo-mechanical design constant of at least 10 mm-W/m*K, the heat spreader positioned in thermal contact with the heat collector, wherein thermo-mechanical design constant of a material is defined by thermal conductivity of the material multiplied by its average thickness.

20 Claims, 1 Drawing Sheet

(51) Int. Cl.
 *H01L 23/34* (2006.01)
 *F21V 29/00* (2006.01)
 *H05K 1/02* (2006.01)
 *H04N 9/31* (2006.01)

(52) U.S. Cl.
 CPC ............ *H05K 1/0203* (2013.01); *F21V 29/004* (2013.01); *F21V 29/242* (2013.01); *F21V 29/246* (2013.01); *H04N 9/31* (2013.01); *H04N 9/3144* (2013.01); *H05K 7/20445* (2013.01)
 USPC .......... 353/52; 165/10; 361/679.46; 361/688; 361/711; 257/712

(56) References Cited

U.S. PATENT DOCUMENTS

| | | |
|---|---|---|
| 2007/0297061 A1 | 12/2007 | Kyomoto et al. |
| 2009/0033880 A1* | 2/2009 | Heo et al. .......................... 353/52 |
| 2009/0096996 A1* | 4/2009 | Kim et al. ........................ 353/52 |
| 2009/0185354 A1 | 7/2009 | Lee et al. |
| 2010/0091251 A1* | 4/2010 | Fujibayashi et al. ............ 353/56 |

FOREIGN PATENT DOCUMENTS

| | | |
|---|---|---|
| EP | 1784007 A2 | 5/2007 |
| EP | 1993334 A2 | 11/2008 |

\* cited by examiner

THERMAL MANAGEMENT FOR HANDHELD PROJECTORS

TECHNICAL FIELD

The present disclosure relates to thermal management for a handheld projector, by which is meant an electronic device incorporating a projector module, especially a projector module employing a laser or at least one light emitting diode (LED) as a light source. More specifically, the present disclosure relates to a projector module which includes a light source comprising a laser or a circuit board having at least one LED mounted thereon, an isotropic heat collector and an anisotropic heat spreader in thermal contact with the heat collector.

BACKGROUND ART

A handheld projector (sometimes referred to as a pocket projector or mobile projector or pico projector) is an emerging technology that applies the use of a projector module in a handheld device, such as a mobile or cell phone, personal digital assistant, global positioning system (GPS) device, headset and/or digital camera, which has sufficient storage capacity to handle sufficient data, i.e., presentation materials, but little space to accommodate an attached large display screen. Handheld projectors can project digital images onto any nearby viewing surface, such as a wall, and necessarily include one or more light sources, which can be one or more lasers or LEDs. An important design characteristic of a handheld projector is the ability to project a clear and bright image, regardless of the physical characteristics of the viewing surface. In use, handheld projectors can be used to project images such as presentations, photographs, videos, maps, games, etc.

In order to have sufficient brightness, resolution and color quality, the light sources employed in projector modules have to be of relatively high power, on the order of about 0.1 watts or more, when lasers are used as the light source, and 1 watt or more when LEDs are used as the light source. With such high power light sources, a significant amount of heat is generated and thermal management is an important consideration in avoiding degradation in the performance of the handheld device in which the projector module is positioned, as well as discomfort to the user.

In providing for thermal management for a handheld projector, some important considerations relate to the ability to channel sufficient heat away from the projector module itself, in order to avoid overheating of the projector module with resultant loss in function or desired lifespan, while not focusing the heat on a specific area or component of the handheld device. The combination of a heat collector, to draw heat from the projector module, and a relatively high surface area, directional heat spreader, such as one formed of anisotropic graphite, such as compressed particles of exfoliated graphite or pyrolytic graphite, has been found uniquely advantageous.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to commercially as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal conductivity due to orientation of the expanded graphite particles and graphite layers substantially parallel to the opposed faces of the sheet resulting from high compression, making it especially useful in heat spreading applications. Sheet material thus produced has excellent flexibility, good strength and a high degree of orientation.

The flexible graphite sheet material exhibits an appreciable degree of anisotropy due to the alignment of graphite particles parallel to the major opposed, parallel surfaces of the sheet, with the degree of anisotropy increasing upon compression of the sheet material to increase orientation. In compressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal and electrical properties of the sheet are very different, by orders of magnitude, for the "c" and "a" directions.

DISCLOSURE OF THE INVENTION

In an embodiment, the present disclosure relates to a handheld device which includes a projector module including a light source, such as a laser or a circuit board having at least one light emitting diode mounted thereon; and a thermal management system having an isotropic heat collector positioned in thermal contact with the handheld projector and a heat spreader positioned in thermal contact with the heat collector, the heat spreader having a surface area greater than the surface area of the heat collector. In certain embodiments, the heat spreader has a surface area at least 1.5 times that of the heat collector; in the most advantageous embodiments, the heat spreader has a surface area at least twice or even at least four times that of the heat collector.

The heat collector is advantageously a metal element, such as copper or aluminum, or alloys thereof. As noted, the metallic material from which the heat collector is formed is isotropic; for the purposes of this disclosure, isotropic means the metallic material has a thermal anisotropic ratio of between 1.0 and 2.0. The thermal anisotropic ratio is determined using the material in a planar (i.e., rectangular) shape and dividing the thermal conductivity of the material when taken in a first direction by the thermal conductivity of the material when taken in a second direction, where the first direction and the second direction assume an angle of between 75° and 105° with respect to each other, and where a larger value is always used as the numerator. For instance, in the case of a relatively flat sheet-like configuration, the thermal anisotropic ratio is calculated by dividing the in-plane thermal conductivity by the through-plane thermal conductivity, or vice-versa.

In certain embodiments, the heat collector assumes a three-dimensional shape, so as to ensure adequate thermal transfer between the light source and the heat collector. More particularly, in an embodiment, the heat collector has at least one and preferably a plurality of sections (sometimes called "fingers") which are bent at an angle of at least about 60° and, in some embodiments, up to about 120° with respect to an adjacent section thereof. As such, the heat collector can be a stamped metal sheet, sized and shaped to permit it to be positioned in thermal contact with the light source at a plurality of locations.

In many embodiments, the heat spreader has an in-plane thermal conductivity of at least about 140 W/m*K, more preferably at least about 220 W/m*K (all thermal conductivity measurements provided herein are taken at room temperature, ~20° C.). The heat spreader is preferably formed of an anisotropic graphite material and should be at least about 0.01 mm in thickness, up to about 2 mm in thickness. Most commonly, the heat spreader is from about 0.075 mm to about 1 mm in thickness. In one specific embodiment, the heat spreader is formed of at least one sheet of compressed particles of exfoliated graphite; in another specific embodiment, the heat spreader is formed of at least one sheet of pyrolytic graphite.

It is to be understood that both the foregoing general description and the following detailed description present embodiments of the invention and are intended to provide an overview or framework for understanding the nature and character of the invention as it is claimed. The accompanying drawings are included to provide a further understanding of the invention and are incorporated in and constitute a part of this specification. The drawings illustrate various embodiments of the invention and together with the description serve to explain the principles and operations of the invention. Other and further features and advantages of the present invention will be readily apparent to those skilled in the art upon a reading of the following disclosure when taken in conjunction with the accompanying drawings.

BEST MODE FOR CARRYING OUT THE INVENTION

Figure 1:
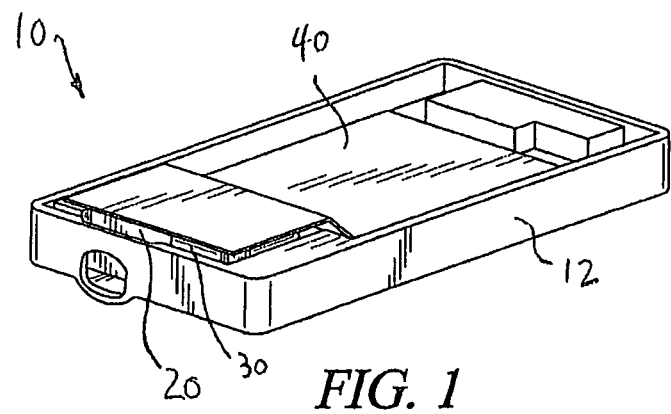
FIG. 1 is a partial, perspective view of an embodiment of a handheld device having a projector module, and a thermal management system in accordance with the present disclosure.
Figure 2:
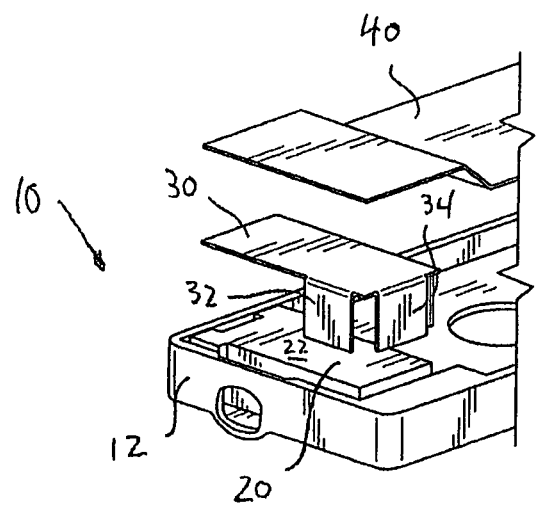
FIG. 2 is an exploded, perspective view of the handheld device of FIG. 1.

As noted, the present disclosure relates to a thermal management system for a handheld device comprising a projector module. By "handheld device" is meant a device readily capable of use while being held in the hand of an adult; exemplary handheld devices include mobile or cell phones, personal digital assistants (PDAs), GPS devices, headsets and digital cameras, or even devices dedicated solely to functioning as a handheld projector. By "projector module" is meant to mean a projector sized to be confined within a handheld device, yet capable of projecting an image that has sufficient size and resolution when projected from a distance of, for instance, about 1 meter (m), or more or less, as desired. More specifically, the image produced by a projector module should have a resolution of at least 240×320 pixels and a size of at least 30×45 centimeters (cm), when projected from a distance of about 1 meter, or more or less. Of course, even higher resolution (up to and higher than so-called high resolution, 1024×768), and larger image size are desired.

Generally, in order to fit within a handheld device, the projector module should have a volume small enough such that the handheld device can still be employed for its primary purpose. In some embodiments, the projector module has a volume of no greater than 144 cm³, and physical dimensions of 8 cm×6 cm×3 cm, in order to fit within a handheld device. Depending on the size and nature of the handheld device, a projector module contained therewithin can be as big as 3000 cm³, and physical dimensions of 20 cm×15 cm×10 cm, in order to fit within certain handheld devices. In certain embodiments, the projector module is contained within a housing, for ease of installation and removal.

The projector module includes a light source and optics, which may provide the light beneficial for projecting the image; the light source is also a main source of heat from the projector. The light source and optics may be sufficiently powerful to generate the desired image brightness and resolution. In certain embodiments, the light source is a laser, which works either by scanning the entire image a dot at a time and modulating the laser directly at high frequency, or by optically spreading and then modulating the laser and scanning a line at a time. Alternatively, in other embodiments, the light source is one or more LEDs mounted on a printed circuit board which controls the illumination of the LED. One or more such circuit boards can be employed in a handheld projector. Alternatively, in some embodiments, the LEDs can be mounted on flexible circuits, either a plurality of LEDs on a single flexible circuit, or a single LED on each flexible circuit but a plurality of such flexible circuits. Such light sources are negatively affected by heat.

In an embodiment, the thermal management system for a projector module disclosed herein includes a heat collector and a heat spreader. The heat collector should be isotropic and is advantageously a metal element, such as copper or aluminum, or alloys thereof. As noted, by isotropic is meant that the material from which the heat collector is formed has a thermal anisotropic ratio of no more than 2.0, preferably less than 2.0, more preferably no more than 1.5, and even more preferably about 1.0. In a certain embodiment, the thermal anisotropic ratio of the heat collector may range from about 1.0 up to about 2.0. The heat collector is positioned in thermal contact with the projector module, more specifically with the light source of the projector module; in certain embodiments of the thermal management system disclosed herein, the heat collector is in thermal contact with the housing of the projector module, which acts as an agent to transfer heat from the light source to the heat collector.

By thermal contact is meant that a first component is positioned in relation to a second component (such as the heat collector positioned in relation to the light source of the projector module, or the heat spreader positioned in relation to the heat collector, as discussed hereinbelow) such that heat is readily transferred from the second component to the first component. Generally speaking, physical contact is the preferred form of thermal contact, although a housing, circuit board, or a heat transfer element, such as a thermal interface material or the like can be positioned between the first component and the second component to facilitate thermal transfer. Indeed, in certain embodiments of the present disclosure, a thermal interface material, such as a phase change material, one or more sheets of compressed particles of exfoliated graphite, or the like, as would be familiar to the skilled artisan, is positioned between the heat collector and the projector module, and the heat collector and the heat spreader, in order to facilitate thermal transfer. An adhesive can be used to maintain the thermal interface material in position, or in some embodiments, an adhesive can be used to ensure good contact between the heat collector and the projector module, or the heat collector and the heat spreader, is maintained.

In one embodiment, the material used to form the heat collector has two major surfaces and a thermo-mechanical design constant of at least 10 mm-W/m*K in order to draw sufficient heat from the projector module. In other embodiments, the thermo-mechanical design constant of the material used to form the heat collector is at least 20 mm-W/m*K. As used herein, the expression "thermo-mechanical design constant" refers to a characteristic of a material having two major surfaces represented by the average thickness of the material (i.e., the distance between the two major surface of the material) multiplied by its in-plane thermal conductivity, and can be used as a measure of the thermal capability of the material (the "amount" of heat the material can dissipate). In some embodiments, the thermo-mechanical design constant of the heat collector material is at least about 110 mm-W/m*K and in other embodiments it is at least about 270 mm-W/m*K, or at least about 440 mm-W/m*K. As noted, in some embodiments, the metal can be aluminum, copper, or alloys thereof. Generally, the thickness of the material for the heat collector is from about 0.05 mm to about 2 mm; in some embodiments, the material is from about 0.1 mm to about 1.5 mm in thickness.

In certain preferred embodiments, the heat collector assumes a non-planar (i.e., three dimensional) shape, having bends or the like in order to position it in thermal contact with a plurality of surfaces of the projector module (such as sides of the housing of the projector module). Indeed, in some embodiments, the heat collector has one or more sections, or "fingers," which extend at an angle of at least 60° from a main body or an adjacent section of the heat collector. In some embodiments, the fingers extend at an angle of from 60° to 120° from a main body or an adjacent section of the heat collector. The fingers increase the surface area of the heat collector which is in thermal contact with the projector module light source. In a further embodiment, the fingers of the heat collector may extend from the main body of the heat collector at an angle that may be at an acute angle or an obtuse angle.

The handheld projector thermal management system of the present disclosure also includes a heat spreader in thermal contact with the heat collector (including the embodiment where a thermal interface material is positioned therebetween, as discussed above) to take heat collected by the heat collector and spread it about the handheld device, in order to reduce the effect of the heat on components of the projector module, components of the handheld device, or the user. The heat spreader thus spreads the heat relatively uniformly about its surface, thereby avoiding hot spots or areas of relatively high, and potentially disadvantageous, heat. As noted, in some embodiments the heat spreader is formed of one or more sheets of compressed particles of exfoliated graphite. In other embodiments, the heat spreader is formed of pyrolytic graphite. By "pyrolytic graphite" is meant a graphitic material formed by the heat treatment of certain polymers as taught, for instance, in U.S. Pat. No. 5,091,025, the disclosure of which is incorporated herein by reference.

In certain embodiments, the heat spreader has a surface area at least 1.5 times the surface area of the heat collector. In other embodiments, the heat spreader has a surface area at least twice, or even at least four times that of the heat collector. While there is no functional upper limit to the amount by which the surface area of the heat spreader exceeds that of the heat collector, a practical limit is defined by the size of the handheld device; generally, the surface area of the heat spreader is up to about eight times that of the heat collector. By surface area of the heat spreader is meant the surface area of one of the major surfaces of the heat spreader; by surface area of the heat collector is meant the surface area of one of the major surfaces of the heat collector. Alternatively, in other embodiments, surface area refers to the total surface area of the heat spreader and the total surface area of the heat collector, respectively.

In advantageous embodiments, the heat spreader has a thermo-mechanical design constant which differs from that of the material from which the heat collector is formed. Preferably, the material from which the heat spreader is formed has a thermo-mechanical design constant that is no less than 50% that of the thermo-mechanical design constant of the material from which the heat collector is formed; in other embodiments, the heat spreader material has a thermo-mechanical design constant that is at least 30% greater than the thermo-mechanical design constant of the material from which the heat collector is formed, more preferably at least 50% greater than the thermo-mechanical design constant of the material from which the heat collector is formed, in order to effectively draw heat away from the heat collector (and, thus, away from the projector module). In some embodiments, the heat spreader material has a thermo-mechanical design constant of at least 10 mm-W/m*K, more preferably at least 145 mm-W/m*K, even more preferably at least 200 mm-W/m*K, or at least 350 mm-W/m*K. In certain preferred embodiments, the heat spreader has a thermo-mechanical design constant of at least 580 mm-W/m*K. In other embodiments, suitable thermo-mechanical design constants may include at least about 20 mm-W/m*K, at least about 50 mm-W/m*K, at least about 75 mm-W/m*K, and at least about 100 mm-W/m*K. Advantageously, the heat spreader has an in-plane thermal conductivity of at least 140 W/m*K, more preferably at least 220 W/m*K, and even more advantageously at least 300 W/m*K; while there is no functional upper limit for the in-plane thermal conductivity of the heat spreader, there is no practical need for it to be higher than 1600 W/m*K. Depending of the material from which it is formed, the thermal anisotropic ratio of the heat spreader should be at least 3.0, and up to about 16,000.

As noted, the heat spreader can be formed of at least one sheet of compressed particles of exfoliated graphite. Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

The graphite starting materials used to provide the heat spreader in the present disclosure may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has a purity of at least about eighty weight percent. More preferably, the graphite employed for the heat spreader of the present invention will have a purity of at least about 94%. In the most preferred embodiment, the graphite employed will have a purity of at least about 98%.

Compressed exfoliated graphite materials, such as graphite sheet and foil, are coherent, with good handling strength, and are suitably compressed, e.g. by roll pressing, to a thickness of about 0.05 mm to 3.75 mm and a typical density of about 0.4 to 2.0 g/cc or higher. Indeed, in order to be consider "sheet," the graphite should have a density of at least about 0.6 g/cc, and to have the flexibility required for the present disclosure, it should have a density of at least about 1.1 g/cc, more preferably at least about 1.6 g/cc. While the term "sheet" is used herein, it is meant to also include continuous rolls of material, as opposed to individual sheets.

If desired, sheets of compressed particles of exfoliated graphite can be treated with resin and the absorbed resin, after curing, enhances the moisture resistance and handling strength, i.e. stiffness, of the graphite article as well as "fixing" the morphology of the article. Suitable resin content is preferably at least about 5% by weight, more preferably about 10 to 35% by weight, and suitably up to about 60% by weight. Resins found especially useful in the practice of the present invention include acrylic-, epoxy- and phenolic-based resin systems, fluoro-based polymers, or mixtures thereof. Suitable epoxy resin systems include those based on diglycidyl ether of bisphenol A (DGEBA) and other multifunctional resin systems; phenolic resins that can be employed include resole and novolac phenolics. Optionally, the flexible graphite may be impregnated with fibers and/or salts in addition to the resin or in place of the resin. Additionally, reactive or non-reactive additives may be employed with the resin system to modify properties (such as tack, material flow, hydrophobicity, etc.).

When employed as a heat spreader in accordance with the current disclosure, a sheet of compressed particles of exfoliated graphite should have a density of at least about 0.6 g/cc, more preferably at least about 1.1 g/cc, most preferably at least about 1.6 g/cc. From a practical standpoint, the upper limit to the density of the graphite sheet heat spreader is about 2.0 g/cc. The sheet should be no more than about 10 mm in thickness, more preferably no more than about 2 mm and most preferably not more than about 0.5 mm in thickness. When more than one sheet is employed, the total thickness of the sheets taken together should preferably be no more than about 10 mm. One graphite sheet suitable for use as the heat spreader in the present disclosure is commercially available as eGRAF material, from GrafTech International Holdings Inc. of Parma, Ohio.

In certain embodiments, a plurality of graphite sheets may be laminated into a unitary article for use in the thermal management system disclosed herein. The sheets of compressed particles of exfoliated graphite can be laminated with a suitable adhesive, such as pressure sensitive or thermally activated adhesive, therebetween. The adhesive chosen should balance bonding strength with minimizing thickness, and be capable of maintaining adequate bonding at the service temperature at which heat transfer is sought. Suitable adhesives would be known to the skilled artisan, and include acrylic and phenolic resins.

The graphite sheet(s) should have a thermal conductivity parallel to the plane of the sheet (referred to as "in-plane thermal conductivity") of at least 140 W/m*K for effective use. More advantageously, the thermal conductivity parallel to the plane of the graphite sheet(s) is at least 220 W/m*K, most advantageously at least 300 W/m*K. From a practical standpoint, sheets of compressed particles of exfoliated graphite having an in-plane thermal conductivity of up to 600 W/m*K are all that are necessary for the majority of handheld projector applications.

In addition to the in-plane thermal conductivity of the sheet(s) of compressed particles of exfoliated graphite, the through-plane thermal conductivity is also relevant. In certain embodiments, the through-plane thermal conductivity of the sheet of compressed particles of exfoliated graphite should be less than 12 W/m*K; in other embodiments, the through-plane thermal conductivity is less than 10 W/m*K. In still other embodiments, the through-plane thermal conductivity of the sheet of compressed particles of exfoliated graphite is less than 7 W/m*K. In a particular embodiment, the through-plane thermal conductivity of the sheet is at least about 1.5 W/m*K.

The expressions "thermal conductivity parallel to the plane of the sheet" and "in-plane thermal conductivity" refer to the fact that a sheet of compressed particles of exfoliated graphite has two major surfaces, which can be referred to as forming the plane of the sheet; thus, "thermal conductivity parallel to the plane of the sheet" and "in-plane thermal conductivity" constitute the thermal conductivity along the major surfaces of the sheet of compressed particles of exfoliated graphite. The expression "through-plane thermal conductivity" refers to the thermal conductivity between or perpendicular to the major surfaces of the sheet.

In order to access the anisotropic properties of the graphite sheet, in some embodiments, the thermal anisotropic ratio of the sheet may be at least about 50; in other embodiments, the thermal anisotropic ratio of the sheet is at least about 70. Generally, the thermal anisotropic ratio need not be any greater than about 500, more preferably no greater than about 250.

In certain embodiments, the heat spreader can be coated with a layer of an electrically insulating material, such as a plastic like polyethylene terephthalate (PET), for electrical isolation.

Additionally, in some embodiments, a biasing material can be interposed between the graphite heat spreader and a component, or a housing or case of the handheld device. The biasing material can be any material which tends to bias the heat spreader against the heat collector to reduce contact resistance and increase thermal contact between the heat spreader and the heat collector. In other words, the biasing material, by being positioned under pressure against the component, housing or case tends to force the heat spreader against the heat collector for greater thermal contact.

Preferred biasing materials comprise compressible and compliant materials such as foams which, when compressed, thereby force the heat spreader against the heat collector, as described. Preferably, the materials used are elastic in nature, so as to create an elastic or "spring-like" pressure in the same direction. Advantageously, the foam employed as the biasing material is a rubber or silicone (or filled silicone) foam. The biasing material can be insulating, if efficient heat transfer from the heat spreader to the housing or case is not desired or it can have good thermal transfer properties, if efficient heat transfer from the heat spreader to the housing or case is desired.

Referring now to the drawings, in which not all reference numbers are shown in every drawing, for clarity purposes, a handheld device in accordance with the disclosure is denoted by the reference numeral 10. Handheld device 10 has a case or housing 12, and includes a projector module 20 disposed therein, projector module 20 including a housing 22, within which is positioned a light source (not shown), which can be a laser or one or more LEDs mounted on a printed circuit board, as well as associated electronics and optics (also not shown). Handheld device 10 also includes a heat collector 30, which is in a three-dimensional shape, including fingers 32 and 34, in order to permit heat collector 30 to be positioned in thermal contact with housing 22 of projector module 20.

Handheld device 10 also includes a heat spreader 40 having a surface area greater than 1.5 times that of heat collector 30, heat spreader 40 positioned in thermal contact with heat collector 30.

Thus, by the practice of the foregoing disclosure, thermal dissipation in a handheld device having a projector module positioned therein is substantially improved, as compared to a similar device without the thermal management system disclosed herein.

All cited patents and publications referred to in this application are incorporated by reference.

The invention thus being described, it will be apparent that it may be varied in many ways. Such variations are not to be regarded as a departure from the spirit and scope of the present invention and all such modifications as would be obvious to one skilled in the art are intended to be included in the scope of the following claims.

What is claimed is:

1. A handheld device, comprising
    a. a projector module which comprises a light source comprising a laser or at least one light emitting diode;
    b. a thermal management system which comprises
    i. a heat collector formed of a material having a thereto-mechanical design constant of at least 10 mm-W/m*K and having a non-planar shape, the heat collector in thermal contact with the light source;
    ii. an anisotropic graphite heat spreader having a surface area at least 1.5 times that of the surface area of the heat collector and a thermo-mechanical design constant of at least 10 mm-W/m*K, the heat spreader positioned in thermal contact with the heat collector,
wherein thermo-mechanical design constant of a material defined by thermal conductivity of the material multiplied by its average thickness.

2. The handheld device of claim 1, wherein a thickness of the heat collector ranges from about 0.05 mm to about 2 mm.

3. The handheld device of claim 2, the heat collector formed from an isotropic material.

4. The handheld device of claim 3, wherein the isotropic material comprises copper, aluminum, or alloys thereof.

5. The handheld device of claim 1, wherein the anisotropic graphite heat spreader comprises a material which comprises compressed particles of exfoliated graphite or pyrolytic graphite.

6. The handheld device of claim 5, the heat spreader having an in-plane thermal conductivity of at least about 140 W/m*K.

7. The handheld device of claim 1, the thermo-mechanical design constant of the heat spreader being no less than 50% of the thermo-mechanical design constant of the heat collector.

8. The handheld device of claim 1, the thermal anisotropic ratio of the heat spreader being at least 3.0.

9. The handheld device of claim 1, wherein the thickness of the heat spreader ranges from about 0.01 mm to about 2 mm.

10. The handheld device of claim 1, wherein the light source comprises a plurality of light emitting diodes mounted on at least one flexible circuit board.

11. A projector module, comprising
    a. a light source which comprises a housing further including a laser or at least one light emitting diode positioned in the housing;
    b. a thermal management system which comprises
    i. a heat collector formed of a material having a thermo-mechanical design constant of at least 10 mm-W/m*K and having a non-planar shape, the heat collector in thermal contact with the light source;
    ii. an anisotropic graphite heat spreader having a surface area at least 1.5 times that of the surface area of the heat collector and a thermo-mechanical design constant of at least 10 mm-W/m*K, the heat spreader positioned in thermal contact with the heat collector,
wherein thermo-mechanical design constant of a material defined by thermal conductivity of the material multiplied by its average thickness.

12. The projector module of claim 11, wherein the thickness of the heat collector ranges from about 0.05 mm to about 2 mm.

13. The projector module of claim 12, wherein the material from which the heat collector is formed is isotropic.

14. The projector module of claim 13, wherein the material from which the heat collector is formed comprises copper, aluminum, or alloys thereof.

15. The projector module of claim 11, wherein the anisotropic graphite heat spreader comprises a material which comprises compressed particles of exfoliated graphite and pyrolytic graphite.

16. The projector module of claim 15, wherein the heat spreader has an in-plane thermal conductivity of at least about 140 W/m*K.

17. The projector module of claim 11, the thermo-mechanical design constant of the heat spreader being no less than 50% that of the thermo-mechanical design constant of the heat collector.

18. The projector module of claim 11, the thermal anisotropic ratio of the heat spreader being at least 3.0.

19. The projector module of claim 11, the thickness of the heat spreader ranging from about 0.01 mm to about 2 mm.

20. The projector module of claim 11, wherein the light source comprises a plurality of light emitting diodes mounted on at least one flexible circuit board.

* * * * *